United States Patent [19]
Boehnen

[11] Patent Number: 5,340,795
[45] Date of Patent: Aug. 23, 1994

[54] METHOD AND APPARATUS TO FACILITATE SUPERCONDUCTIVITY BY EXCITING A MATERIAL AT ITS RESONANT FREQUENCY OF MOLECULAR VIBRATION

[76] Inventor: Daniel A. Boehnen, 1244 Blue Hill Ter., Northbrook, Ill. 60062

[21] Appl. No.: 888,056

[22] Filed: May 22, 1992

Related U.S. Application Data

[63] Continuation of Ser. No. 532,737, Jun. 4, 1990, abandoned, which is a continuation of Ser. No. 208,672, Jun. 20, 1988, abandoned.

[51] Int. Cl.$^5$ .................. H01L 39/00; H01L 39/24; H01B 12/00
[52] U.S. Cl. .................. 505/100; 174/125.1; 204/155; 264/22; 324/228; 505/727; 505/881; 505/884; 505/210
[58] Field of Search .................. 324/228, 248; 264/22; 204/140, 155; 174/125.1; 505/1, 727, 825, 843, 881, 884, 887

[56] References Cited

PUBLICATIONS

"Superconductor Research Blazes New Trail", Chicago Tribune, May 1, 1988.
"The Science of Superconductors" by William Steele, Cornell Alumni News, Feb. 1988, p. 29.
"Superconductors: The Long Road Ahead", by Foner, et al., Technology Review, Feb./Mar. 1988, p. 34.
IEEE Standard Dictionary of Electrical & Electronic Terms, (1972 Ed.) p. 572.
"Basic Electricity & Electrons" by Looper, et al., (1979 Ed.) pp. 7-8.
"Electronic Engineers Handbook" by Fink & Christianson, 2d Ed. 1982 P. 1-33.
"The effect of Intramolecular Vibrations on the Transition Temperature of High $T_c$ Superconductors" by Lai, et al., Solid State Communications, vol. 64, No. 3 pp. 317-320, (Oct. 1987).
"Raman Structure of Ba-Y-Cu-O System" by Doagi, et al., Solid State Communications vol. 64, No. 6, pp. 887-880 (Nov. 1987).
"The Characterization of High-Critical Temperature Ceramic Superconductors by Vibrational Spectroscopy" by Ferraro & Maroni, Applied Spectroscopy, vol. 44, No. 3, pp. 351-366 (1990).
"Determination of the Superconducting Gap in $RBa_2 CU_3 O_{7-\delta}$", by Freidl, et al. Physical Review Letters, vol. 65, No. 7, pp. 915-918 (Aug. 1990).
"Lattice Instabilities, Isotope Effect and High $T_c$ Superconductivity in $La_{2-x} Ba_x CuO_4$" by Pickett, et al., Physical Review Letters, vol. 67, No. 2, pp. 228-231 (Jul. 1991).

*Primary Examiner*—Gerard R. Strecker
*Attorney, Agent, or Firm*—Allegretti & Witcoff, Ltd.

[57] ABSTRACT

Improved methods, apparatus, and compositions for achieving superconductivity are disclosed. The methods and apparatus are based upon applying an external driving force, i.e., either an electrical current or a magnetic field, at a predetermined frequency. The predetermined frequency is chosen to equal one or more of the resonant frequencies of the molecular vibration of the atoms which provide conductivity to the material. The compositions of the invention require a continuous bridge or network of electrically compatible atoms between the opposite poles of the electrical pathway. Another aspect of the invention provides a method for determining the resonant frequency of molecular vibration, i.e., the frequency at which the external driving force should be applied. In this aspect of the invention, the composition is exposed to one or more sources of electromagnetic energy which radiate at known frequencies. The response of the composition to the various frequencies of radiation is measured and compared. The frequency at which the material exhibits the sharply increased response is designated a resonant frequency of the material.

47 Claims, 3 Drawing Sheets

METHOD AND APPARATUS TO FACILITATE SUPERCONDUCTIVITY BY EXCITING A MATERIAL AT ITS RESONANT FREQUENCY OF MOLECULAR VIBRATION

This is a continuation of application Ser. No. 532,737, filed Jun. 4, 1990, now abandoned, which is in turn a continuation of application Ser. No. 208,672, filed Jun. 20, 1988, now abandoned.

BACKGROUND OF THE INVENTION

This invention relates to methods, compositions, and various techniques for improving, i.e., increasing, the temperature at which various materials, particularly metal oxide composites, will exhibit superconductivity.

At ordinary temperatures, the electrical conductivity of substances extends over a tremendous range, from about $1.6 \times 10^{-8}$ ohm.cm for silver to at least $10^{16}$ ohm.cm for such dielectrics as quartz. The range is even greater at very low temperatures.

Superconductivity is a property of materials characterized by essentially zero electrical resistivity (i.e., infinite conductivity). Superconductivity was believed to occur in elements having two to five valence electrons outside the closed shell. It occurs at a transition temperature below which the material is superconducting and above which the material is not.

Superconductivity was discovered in 1911, just three years after refrigeration techniques were invented that could liquefy helium at 4 degrees Kelvin (i.e., "4K"). A Dutch scientist, H. Kammerlingh Onnes, found that mercury lost all resistance to electricity when cooled in the liquid helium. Superconductivity was thereafter confirmed in other metals when cooled with liquid helium. In the early 1970's, scientists discovered metal alloys of niobium and germanium that exhibited superconductivity at temperatures as high as 23K. A search for still higher temperature superconductors was largely unsuccessful at that time.

Superconductivity is conventionally explained on the hypothesis that virtual distortions in the metal ion lattice provide an attractive interaction between conduction electrons which causes them to form bound pairs. At sufficiently low temperature, these pairs "condense" into a superconducting state separated by an energy gap from the normal conducting state. In the superconducting state, collisions with lattice vibrations or impurities do not have enough energy to excite the system above the energy gap, and supercurrents flow without resistance. In the normal conducting state there is no energy gap, and collisions of the electrons with lattice vibrations and impurities excite the system, giving rise to energy losses. These energy losses appear as a finite resistivity.

In a superconductor, according to the conventional theory, electrons see an attractive interaction arising from distortions of the metal ion lattice. As the first electron moves through the lattice, its negative charge repels the negative electron cloud and attracts the positively charged ions, causing the lattice structure to appear to pucker or squeeze together. The second electron is attracted to this concentration of positive charge. The second electron "follows" the first, making it seem as though the two are attracted to each other.

In 1986, the scientific world began reporting the achievement of superconductivity at higher temperatures. However, the concepts used to explain superconductivity in the older materials do not work well for the new superconductive materials. As the superconducting transition temperature of a material increases, for example, the old formulae suggests that the electron pairs must be bound together more strongly to keep from being dissociated by thermal energy. According to the old formulae, the binding force should not be strong enough to hold the electron pairs together at the higher temperatures.

Many theories have been proposed to explain the electron pairing. However, none of them have provided a basis for improving the superconductive properties of a material. Similarly, the new theories have not provided an adequate basis for explaining many of the observed phenomena of superconductivity.

SUMMARY OF THE INVENTION

Accordingly, it is an object of the present invention to provide new methods and devices that facilitate superconductivity at higher temperatures than heretofore possible.

Yet another object of this invention is to provide a technique by which conventional materials can achieve superconductivity at higher temperatures than heretofore possible for those materials.

It is another object of the present invention to define compositions that achieve superconductivity at higher temperatures than heretofore possible.

These and other objects, advantages and features of the invention will be set forth and apparent from the descriptions and claims which follow.

The technique of achieving superconductivity according to the present invention arises by coordinating the principles of resonance frequency with those of electrical conductivity. "Resonance" and/or "resonant frequency" in this context refers to the frequency at which the molecules of the conducting material vibrate at a given temperature.

As will be apparent to a person of ordinary skill in the art, the molecules may have more than one mode of vibration, depending upon the structure of the conducting material. Each mode of vibration is associated with a different resonance frequency, such that the molecules may have more than one possible resonance frequency. The "fundamental" frequency associated with the fundamental mode or vibration, is the predominant frequency at which the molecules vibrate at a given temperature.

In one embodiment, the invention comprises a method and apparatus for applying a voltage of electricity, i.e., electrical potential, across the conducting material at a predetermined frequency. In another embodiment, the method and apparatus comprise applying a magnetic field across the conducting material at a predetermined frequency and in a predetermined direction. In either case, the predetermined frequency is preferably the fundamental resonance frequency or a harmonic of the fundamental resonant frequency of the molecular vibration of the atoms which conducts the electrical current. Most preferably, the frequency is substantially equal to the fundamental resonant frequency.

In yet another embodiment, the application of an electrical potential across the material and the application of a magnetic field across the material are implemented at the same time. The magnetic field and the electrical potential are preferably applied at substantially the same frequency as previously described. In this embodiment, the magnetic field can be applied in a direction either transverse or parallel to the direction of the applied electrical potential. If the magnetic field is applied in a direction parallel to the direction of the applied electrical potential, then the frequency of the magnetic field is most preferably 180° out of phase with the frequency of the electrical potential. Conversely, if the magnetic field is applied in a direction transverse to the direction of the applied electrical potential, then the frequency of the magnetic field is preferably applied in a frequency which is substantially in phase with the electrical potential.

Although the precise mechanism of operation of the invention is not known, it is believed that the specified application of electrical potential and/or magnetic field synchronizes the movement of electrons to the vibration of the conductive molecules. The application of the electrical potential and/or magnetic fields is believed to excite those lattice vibrations, inducing superconductivity. The invention is also believed to minimize the random entropy of the molecular vibration which is believed to also contribute to electrical resistance. As a result, the conducting material achieves superconductivity without the extreme supercooling that is necessary to eliminate or minimize molecular vibration in conventional superconductivity methods.

The conducting material used in the practice of this invention preferably comprises metal oxides, i.e., oxides of metallic atoms having between about one and three electrons in their outermost level of electrons, although any material of conductive metal atoms can be used. The structure of the conducting material must be such that a continuous bridge or network of electrically compatible metallic atoms extends between the positive and negative poles of the electric potential. By "bridge or network" of atoms is meant one or more paths formed between the positive and negative electrical poles by contiguous or adjacent metallic atoms, metaphorically like a path of contiguous lily pads across a pond. By "electrically compatible metallic atoms" is meant atoms that not only have between one and three electrons in their outermost level of electrons, but wherein also the outermost level of electrons of the atoms is comprised by the same electron level.

In practice of the present invention, the preferred resonant frequency can be determined by exposing the conducting material to electromagnetic energy which is radiated at a specific known frequency, and measuring the response of the material to the radiated energy. That is, the conducting material will respond to the exposure by re-radiating energy. Comparing the response of the material to the initial radiated energy at the various different frequencies will identify which energy frequencies produce the greatest response in the material. These frequencies of greatest response identify the preferred resonant frequencies of the material.

These and other objects, advantages, and features of the invention will be made more apparent in the following drawings and detailed descriptions.

DESCRIPTION OF THE DRAWING

The following Detailed Description will refer to the Drawing which includes the following Figures:

FIG. 1A illustrates the conventional understanding of ordinary electrical conductivity through an essentially pure metal substance.

FIG. 1B illustrates the conventional understanding of how superconductive metal oxides "pump" electrons in a superconductive situation.

DETAILED DESCRIPTION OF THE PREFERRED EMBODIMENT

The present invention provides a technique for overcoming limitations on superconductivity resulting from prior teachings. For example, prior teachings are believed to discount using alternating current (AC) in superconductivity situations, and prior teachings are believed to teach that the presence of a magnetic field lowers the threshold temperature at which superconductivity occurs. This invention overcomes these limitations by recognizing a fundamentally new concept underlying the superconductive phenomena by applying a fundamentally different approach toward achieving superconductivity.

Figure 1A:
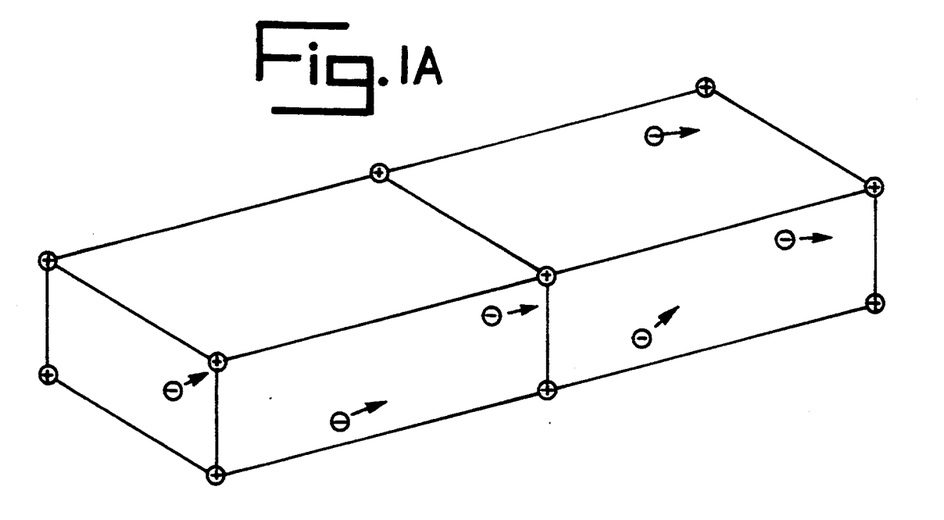
FIGS. 1A and 1B comprise a set of two figures, which collectively illustrate the conventional theory of electrical conductivity.
Figure 1B:
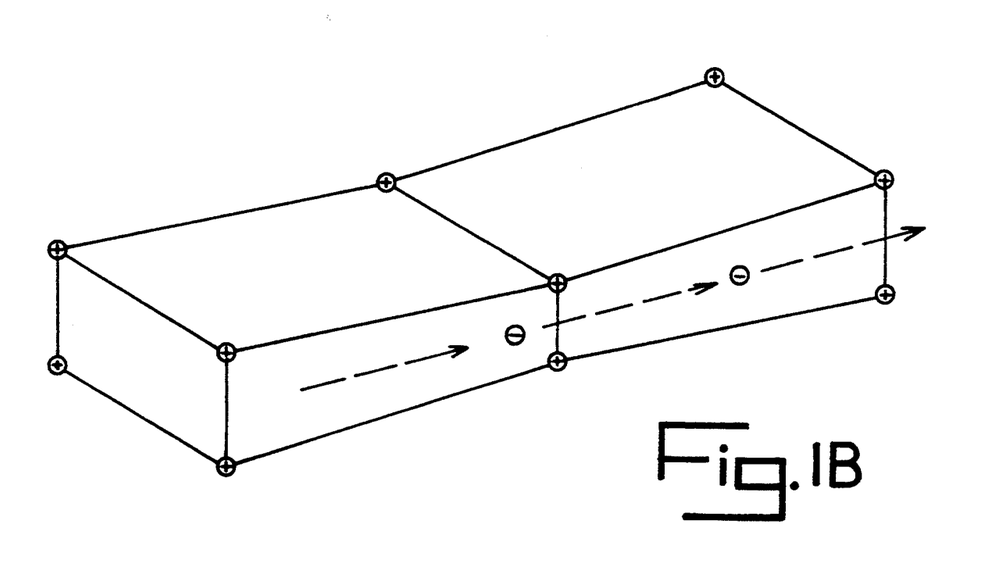

A conductor, such as copper wire, is typically pictures as a substantially regular crystal lattice of copper atoms. As illustrated in FIGS. 1A and 1B, prior teachings on superconductivity propose that atoms conduct electricity in a different way during superconductivity than during ordinary conductivity. In ordinary conductivity, as shown in FIG. 1A, electrons arc conventionally pictured as flowing through the lattice, much like water flows through a pipeline. Electrical resistivity allegedly results when the moving electron collides with other electrons, or metal ions, or impurities in the wire, thereby disrupting the electron flow through the metal "pipeline".

Superconductivity is conventionally attributed to the condensation of bound pairs of electrons into the superconducting state. The bound pairs are formed by an attractive interaction between electrons induced by vibrations of the metal ion lattice, as shown in FIG. 1B. Specifically, as the first electron of the pair moves through the lattice, its negative charge is said to attract a nearby ion, causing the lattice structure to pucker. The second electron of the matched pair then follows the first, making it appear as if the two electrons are attached to each other and travel in a pair. According to conventional description, after the two have passed, the lattice returns to its original shape until another electron pair pass by.

The present invention provides and uses a new and different explanation of the observed phenomena. That is, this invention recognizes that the movement of any given electron influences nearby metal ions and other electrons, but rejects the notion that the ions pump the electrons or that the electrons travel in pairs. Moreover, the present invention assumes that the method by which electricity is conducted under superconductive conditions is basically the same as the method by which electricity is conducted under ordinary conditions, and that previously unrecognized factors determine whether superconductivity will be achieved. Once these previously unrecognized factors are illuminated, the present invention teaches methods and apparatus by which these factors can be reduced to practice and applied for widespread use.

The precise mechanism by which the invention achieves results is not completely understood. The explanation of the invention provided herein yields one understanding of the present inventive technique. However, the invention is not to be limited or judged simply by the present explanation of the mechanism of the invention. Moreover, the ability to reduce the invention to practice and to apply the invention to widespread use is not limited by the accuracy of this present theory.

Initially, the present explanation asserts that conducting electrons do not move through a conductor as water flowing through a pipeline. That analogy seems to be useful for persons designing or constructing electrical wiring set-ups, because the analogy seems to describe the phenomena that electrical input at one end of a conductor exits at the other end of the conductor, less electrical resistance. However, this macroscopic observation misleads the person who uses the analogy to try to understand superconductivity. The present invention assumes, to the contrary, that when a conducting electron enters one end of a circuit, no assumptions should be made or need be made as to when or where that the same electron emerges from the other end of the circuit.

The theory of the present invention disagrees with the concept that electrical resistance occurs when electrons "collide with" other electrons, or ions, or impurities in the conducting metal. That prior art suggestion fails to offer sufficient consistency in explanation as to why a lowered temperature can bring about superconductivity. The present invention assumes simply that electrical resistance occurs simply because the electrical potential which drives the conducting phenomena, i.e., the driving force sometimes referred to as the electromotive force of "EMF", has influenced the conducting electron to move into a position or situation, which the electron would normally avoid without the influence of the EMF. Such situations which the electron would normally reject include moving to an atom which offers only a different electron level as the outermost level of electrons or which has an overall neutral or negative electrical charge.

Additionally, the present invention discards the notion that the conducting electrons travel in pairs during superconductivity, but not during ordinary conductivity. To the contrary, the present invention assumes that the relationships among the clectrons are substantially similar, if not identical, under both superconductivity and ordinary conductivity.

Figure 6:
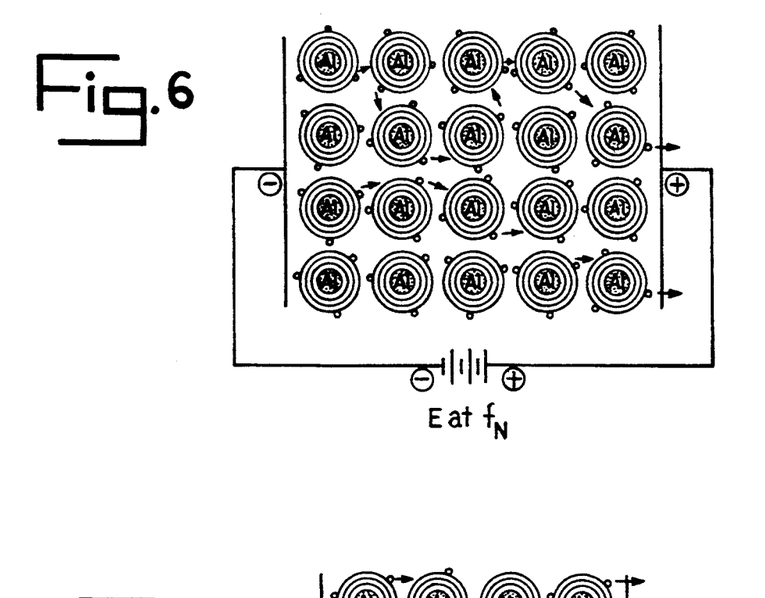
FIG. 6 illustrates how the electrons are believed to move among atoms during electrical conductivity in support of the theory of this invention.

As previously noted electrically conducting metals typically have three or fewer electrons in their outermost electron shell. Aluminum, for example, as shown in FIG. 6, has three electron orbit levels, with three electrons located in the third or outermost level. During conductivity of aluminum, electrons in the third level move from one atom to another, with the overall electron movement being influenced by the applied EMF, thereby giving rise to an electrical current between the two ends of the metal.

An elementary aspect of electrically conductive metals holds that the outer level of electrons (sometimes referred to herein as "conducting electrons") are not tightly bound to a given atom. According to the present invention, when an electron is orbiting within the outer level of a given atom and before the electron moves to the outer level of another atom, the electron is located or moving within a "sphere of influence" dominated by the nucleus of the given atom.

In conditions without an applied EMF, electrons in the outer levels of atoms move or drift among the various spheres of influence in a manner analogous to Brownian Motion. The movement of the electrons among the spheres of influence of various nuclei in this situation is most probably dominated by the laws of entropy. All of the outer level electrons of any given atom are, on average, influenced by their dominant nucleus to the same degree. Thus, any one of these outer level electrons is as capable as any other of moving from the sphere of influence of one nucleus to another nucleus. This drifting of the outer level electrons is believed to occur continuously and randomly among the atoms.

An initial point to recognize, as illustrated in FIG. 6, is the interrelationship that exists among the electrons, regardless of whether an EMF is applied. When a first electron drifts from the sphere of influence of a first nucleus to that of a second nucleus, another electron will leave the influence of the second nucleus, moving to a third nucleus. Similarly, a third electron will enter the sphere of influence of the first nucleus to replace the first electron. The process occurs on a macroscopic level in such a way that overall neutrality is maintained.

From the perspective of this limited explanation, it is somewhat true, but misleading, to describe the electrons as moving in pairs. It is true that each moving electron can be associated with movement of another electron, but in reality each electron is moving individually under the influence of its own environment. The movement of one electron leaving a particular sphere of influence necessarily influences other electrons. Yet one specific electron does not continuously influence a particular second electron. The equanimity among outer level electrons precludes the assumption that any two specific electrons will continuously move in a pair. In reality, a given conducting electron will be "paired" with different second electrons at different times.

As previously noted, conventional theories of superconductivity hold that the nuclei tend to "pucker" as the electrons move, as illustrated in FIG. 1B. The present invention assumes that to the extent such nuclear distortion occurs at all, it occurs during ordinary conductivity as well as in superconductivity. Indeed, such distortion would tend to occur every time an outer conducting electron has begun movement to a second nuclei, and the respective nuclei experience an unbalanced electrical charge for an instant.

It is misleading, however, to think of the nuclei distortion or "pumping" or "puckering", as causing the movement of the electron. In reality, it is probably just as misleading to assume the reverse, i.e., that the movement of the electron causes the distortion of the nuclei lattice. More correctly, either of these events can give rise to the other; each event is as capable of leading as it is of following the other; both are part of the overall environment that effects the movement of electrons and electrical conductivity.

The present invention of superconductivity recognizes that all of these movements occur simultaneously at all times and with relative equality to overall result. The nuclei are moving due to both natural vibration and induced motion, i.e., "pumping". At the same time, the outer level electrons are drifting among the various spheres of influence due to both entropy and movement of the nuclei. The electron drift itself influences the movement of other electrons as well as the vibration and pumping movement of various nuclei, and vice versa.

Superimposed over the inherent atomic level of activity is the effect of the applied electrical potential, or EMF. The distinguishing feature of non-conductivity versus conductivity, as illustrated in FIG. 6, is that the electron drift assumes an overall dominant direction, driven by the external influence of the applied EMF. Electrical resistance occurs during conductivity because the applied EMF causes the electrons (or the vibrating nuclei) to temporarily assume positions and/or locations to which they were not otherwise suited.

For example, considering FIG. 6 and ordinary conductivity, when a conducting electron of one atom is driven by an applied EMF into the sphere of influence of an adjacent nucleus, and assuming this occurs before another outer level electron is in a position to readily leave the influence of that adjacent nuclei, there will be a finite time period wherein the adjacent nucleus has an unbalanced level of four (4) outer level electrons and an overall negative electrical charge. The resulting tension will create distortion between the electrons and among the electron levels. One of the outer level electrons will be forced to leave the sphere of influence of the nucleus, before it would otherwise be ready to do so. Most probably the departing electron will be driven to another nuclei, adjacent the first nuclei and in the direction of the applied EMF. However, the energy required to drive this procedure at a forced, or unnatural pace, manifests itself as heat and electrical resistance.

The simple beauty of superconductivity according to this invention lies in realizing that the instantaneous force imbalances of ordinary conductivity do not occur during superconductivity. The movement of a first conducting electron from a first nucleus to an adjacent nucleus, and a second conducting electron from the adjacent nucleus to a third nucleus, and the distortion of the first, second, and third nuclei toward and away from each other, all occur in harmony, or at least with sufficient harmony that resultant tension does not create significant heat and electrical resistance. In order for this to occur, the harmony of such motion must occur throughout the entire path of electrical conductivity.

Trying to understand the phenomena by assuming that one event "causes" the next, misleads the thinker away from the underlying phenomena. All events happen simultaneously. Superconductivity can be induced by driving the motion of the electrons and the nuclei so that the necessary motions for electrical conductivity will occur simultaneously and in harmony throughout the path of electrical conductivity in the material.

Figure 2:
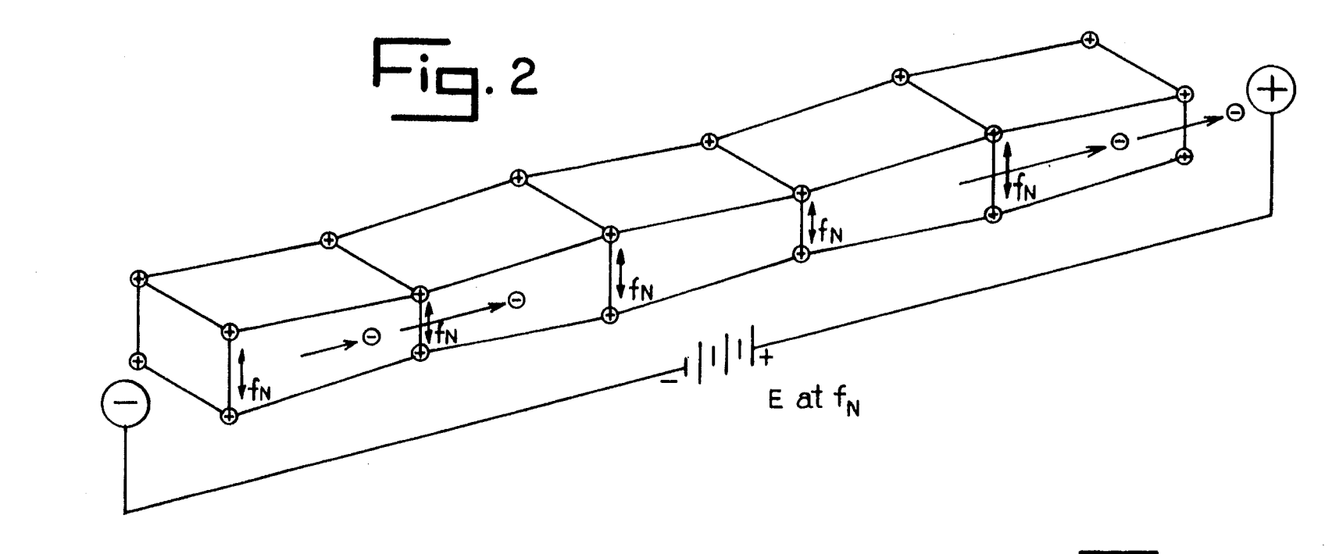
FIG. 2 illustrates the understanding of how superconductivity can be facilitated and improved by applying the principle of resonant frequency ($f_n$) interaction in accord with this invention.

Superconductivity is induced in accordance with the present invention by applying a driving force influence on the conducting material such that all of the necessary motions occur in unison. In order to achieve harmony effectively, the forcing influence is applied at a preferred frequency, generally a resonant frequency of molecular vibration of the nuclei of the conducting material, and most preferably the frequency of the fundamental mode of vibration of the metal atoms which conduct electricity in the material. This situation is illustrated, for example, in FIG. 2.

The individual atoms of a given material vibrate at a predetermined frequency, dependent upon the temperature and lattice structure of the material. Generally, all of the atoms will vibrate at substantially the same frequencies if the material is substantially homogenous.

Due to entropy considerations, however, the vibration of each atom will be shifted in phase to some degree from the vibration of adjacent atoms. The amplitude of molecular vibration will increase to some degree as the enthalpy stored in the material increases. As the temperature of the material increases, both the entropy and the enthalpy of the material increase. As a result, the previously described situations of resistivity occur more frequently at higher temperatures.

Below the critical temperature of a given material, where superconductivity exists, resistance disappears for low levels of direct current ("D.C."). In these situations, the nuclei are relatively stable, i.e., they have relatively low frequency and amplitude of vibration. The outer level electrons are therefore more frequently in a position where they can easily move between spheres of influence of adjacent nuclei. At relatively low current levels, the frequency of electron movement is sufficiently small that situations of resistivity do not occur or, if they do occur, they are sufficiently infrequent as to avoid causing a chain reaction of resistivity situations.

As the temperature of a material increases, both the amplitudes of molecular vibration and the phase differences in vibration of adjacent molecules also increase. As a result, the probable occurrence of situations of resistivity also increases. Similarly, when current density increases, the frequency of electron movement and the situations of resistivity increase, until a critical point is reached and, like a multi-car pile up on an expressway, one resistivity situation creates another. The essentially simultaneous, harmonious, movement of outer level electrons and nuclei breaks down. Beyond this point, an entirely new equilibrium of enthalpy, entropy, and resistivity establishes itself.

Although the specific reason why metal oxide ceramics have higher critical temperatures is not known, nor is the reason necessary for practice of this invention, this invention suggests a consistent explanation. Certain of the ceramics provide a continuous network of adjacent electrically conducting metal atoms, similar to the crystal lattice of a pure metal. In higher temperature superconducting ceramics, however, the atoms of conducting metal are structured in a non-homogenous lattice having internal stresses that limit the amplitude and phase shift of molecular vibration to a greater degree than in a pure metal. Because of these limitations, the ceramics can accept electron drift at higher temperature than the homogenous pure metal lattice without creating situations Of electrical resistivity.

The present invention recognizes for the first time that superconductivity can be facilitated by applying an external driving force at a predetermined frequency, preferably a resonant frequency or some harmonic thereof of the molecular vibration. Most preferably the frequency of the driving force should equal the fundamental resonant frequency of the molecular vibration. The external driving force reduces or eliminates phase shift between the movement of adjacent molecules, nuclei, and electrons. The external driving force orchestrates the subatomic movement so that, when electrons are in a position to move to an adjacent sphere of influence, the adjacent sphere is in a position to readily accept the electron.

Prior art teachings on superconductivity are believed to have noted that superconductivity could not be achieved using alternating current (A.C.). Superconductivity can be achieved in accord with this invention with A.C., by applying the A.C. electrical potential at a proper, resonant frequency, preferably the fundamental frequency of molecular vibration of the conducting material. Of course, the invention could also be practiced by applying a single polarity electrical potential across the material at the requisite frequency.

Figure 3:
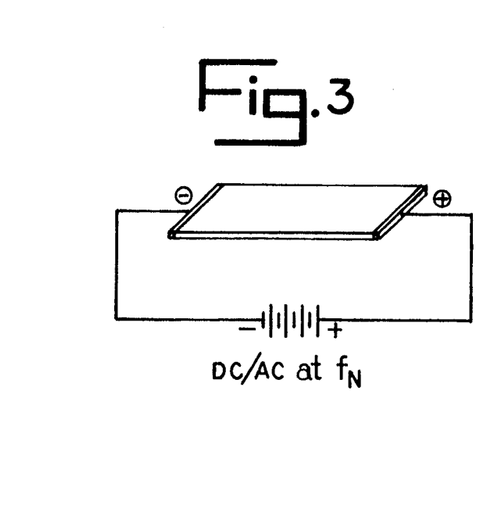
FIG. 3 illustrates a method and apparatus for implementing the principle of resonant frequency ($f_n$) interaction in accord with the invention when applying the electrical potential across the conductive material.

FIG. 3 schematically illustrates a wafer of material made to achieve superconductivity in accordance with this invention. An electrical potential is applied across the material by a device that supplies an electrical current at a predetermined frequency, preferably a resonant frequency of molecular vibration of the material, most preferably the natural or fundamental resonant frequency of the material.

Similarly in accordance with the present invention, the applied force may comprise an imposed magnetic field. The magnetic field, applied at a proper predetermined frequency, will similarly synchronize the phase vibration of the molecules and facilitate superconductivity.

The magnetic field will, of necessity, be applied in a specific, predetermined direction. Preferably, the field will be substantially homogenous. Also in preferred form, the direction of the magnetic field will be transverse to the desired path or direction of the electrical current passed through the material. In some situations, however, depending upon aspects of the electrical current to be conducted, the magnetic field may be applied in a direction parallel to the path of the electrical current.

Figure 4:
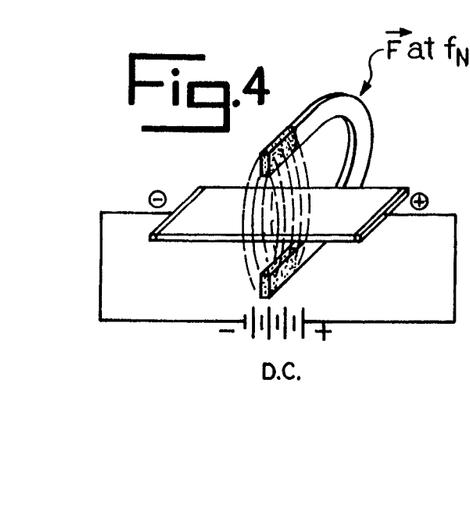
FIG. 4 illustrates another method and apparatus for implementing the principle of resonant frequency ($f_n$) interaction of the invention when applying a magnetic field across the conductive material.

FIG. 4, for example, schematically illustrates a wafer of material made to achieve superconductivity in accordance with this additional embodiment of this invention. A magnetic field is applied across the material by a device that creates an alternating magnetic field at a predetermined frequency, preferably a frequency which is a harmonic of the frequency of molecular vibration of the nuclei of the conducting material, most preferably the natural or fundamental resonant frequency of the material.

As may be apparent by now to the astute observer, the natural resonant frequencies of the molecular vibration of the material may span a wide range. Thus, the device for applying the alternating external force, i.e., either electrical potential or magnetic field, should most preferably be able to adjust the frequency of the external driving force, in such a way that the frequency can be increased or decreased as necessary when the temperature of the material is increased or decreased. Alternatively, the invention will preferably provide a means for precisely controlling the temperature of the conducting material to a predetermined level wherein the frequency of molecular vibration matches that of the external driving force. The former means for adjusting the predetermined frequency should be in a form apparent to a person of ordinary skill in the art using electronic feedback controls.

Figure 5:
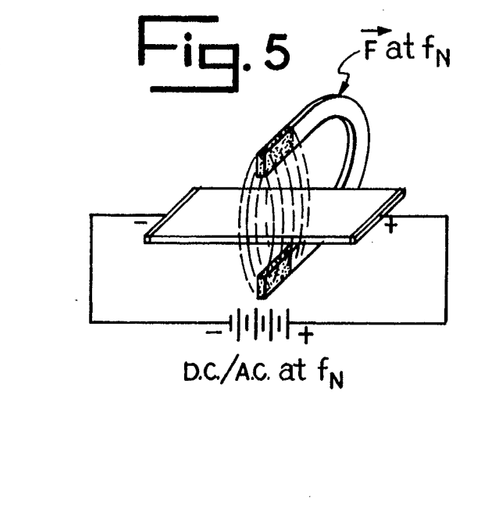
FIG. 5 illustrates another method and apparatus for implementing the resonant frequency ($f_n$) principle of the invention when applying both electrical potential and magnetic field across the conductive material.

In particularly preferred form, the invention comprises a method and apparatus, as shown in FIG. 5, where both the electrical potential and the magnetic field are applied across the material at predetermined frequency. The electrical current may be applied at a first frequency, and the magnetic field may be applied at a second frequency, but preferably the two frequencies would be identical. The selection of the two frequencies would be consistent with the previous teachings herein.

When electrical potential and magnetic field are applied, the phase relationship between the two forces is carefully controlled. Preferably the magnetic field is applied in either a zero phase or a 180° phase relationship with the electrical potential. If the magnetic field is applied in a direction perpendicular to the path of the electrical current, then the magnetic field will be preferably applied in a zero phase relationship with the electrical potential. Conversely, if the magnetic field is applied in a direction parallel to the direction of the electrical potential, then the magnetic field will preferably be applied in a 180° phase relationship with the electrical potential.

Another aspect of this invention involves determining the natural resonant frequencies of molecular vibration of the nuclei of the conducting material. According to this aspect of the invention, the natural resonant frequencies of molecular vibration arc those frequencies at which the external electromagnetic energy should be applied to the material to facilitate superconductivity. Such frequency is determined by exposing the material to radiant electromagnetic energy at one or more preselected frequencies. In general practice, the electromagnetic energy will be radiated over a broad band or range of frequencies which have been determined, through empirical knowledge, to bracket the true natural resonant frequency of the material at the temperature in question.

The material absorbs and re-emits radiant energy at its resonant frequency or frequencies according to principles of spectroscopy understood by a person of skill in those arts. Thus, a resonant frequency can be determined by measuring the response of the material to the radiated energy. That is, resonant frequencies can be determined by measuring the frequency of either the radiated energy absorbed by the material or the energy re-emitted by the material in response to the exposed energy. Resonant frequencies are those at which the material exhibits sharply greater response to said exposure. Usually resonant frequencies will be observed as a sharp peak in the response curve of the material to the exposed radiation. The preferred natural or fundamental resonant frequency of the material, is normally the frequency at which the material exhibits the greatest response.

Although it is not intended to limit the materials with which the prior aspects of this invention can be used, certain materials—particularly the relatively new ceramic metal oxide materials—provide additional benefits for the invention. As has been now explained, superconductivity results by providing a controlled, synchronized, electron drift among outer level electrons. Certain limitations and aspects of the ceramic design also occur.

The description of preferred embodiments of this invention has previously made reference to an essentially continuous network of adjacent conducting atoms. In order for the outer level electrons to move freely, they should preferably have adjacent atoms with the same outer electron level.

Figure 8:
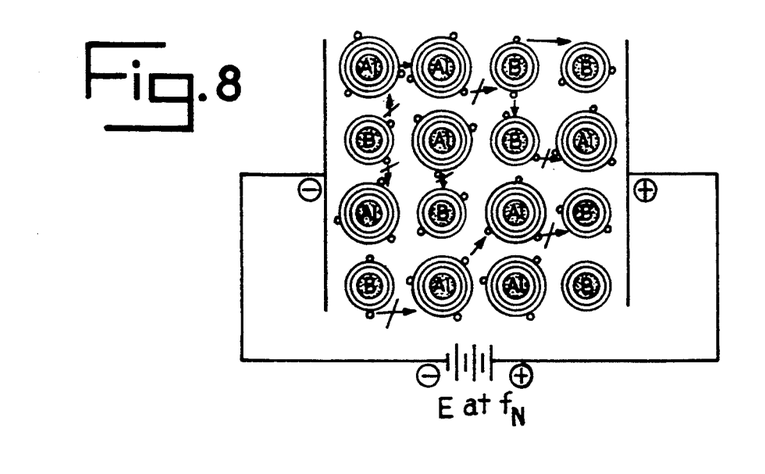
FIG. 8 illustrates the resistivity of electron transfer among atoms that do not have the same electron level as their outermost level of electrons.

Shown in FIG. 8, for example, is a hypothetical lattice of conducting atoms of aluminum and boron. Aluminum has three levels of electrons. Boron has two levels of electrons. Superconductivity cannot be achieved if the outer level electrons are required to move along a path involving relatively frequent movement between the aluminum atoms to the boron atoms, i.e., between the third and second electron level. The outer level electrons in the aluminum will necessarily exhibit resistance against moving into the outer level of the boron atoms, and vice versa.

Figure 7:
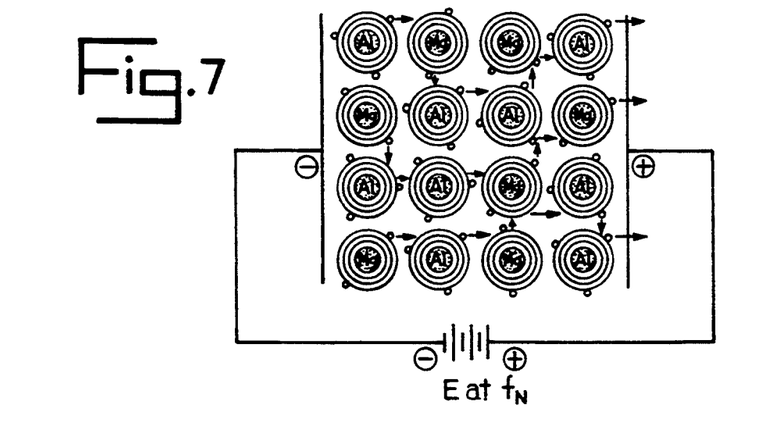
FIG. 7 illustrates the conductivity of electron transfer among atoms having the same electron level as their outermost level of electrons.

FIG. 7 shows a hypothetical lattice of ceramic comprising atoms of aluminum and magnesium. Here both atoms have three levels of electrons and the electrons can move between spheres of influence without changing the level of electron orbit. In order for superconductivity to occur in a material, therefore, the material must have an essentially continuous network, bridge, or path of compatible atoms extending between the poles of the electrical current. By "compatible atoms" is meant that the adjacent atoms must have the same electron level comprising the outer electron level of the material.

In order to achieve the continuous network of compatible atoms, the composition of the atom must be controlled in several respects. The proportion between metal (conducting) atoms and non-metal (non-conducting, i.e., oxygen) atoms must be controlled. If different metallic atoms are present, the relative concentration and the relative sizes of the atoms must be such as to permit a continuous network. As noted, the network must include a continuous path of conducting atoms that have the same outer electron level. The empirical process of mixing, and sintering the oxides must create a sufficiently uniform material as to prevent a gap or pocket in the conducting network.

The foregoing description provides information on preferred aspects of the present invention. However, implementation of the invention through variations not described herein is expected. Therefore, the invention is to be limited only by the following claims and their equivalents.

What is claimed is:

1. A method of improving the passage of an electric current through a material which exhibits superconductivity at a relatively low temperature, such that the material will exhibit superconductivity at a relatively higher temperature, comprising the step of applying an electrical potential across the material at a predetermined frequency substantially equal to a resonant frequency of the molecular vibration of the material.

2. The method of claim 1 wherein said predetermined frequency is substantially equal to the fundamental resonant frequency of molecular vibration of the material.

3. The method of claim 1 wherein the resonant frequency of molecular vibration of the material is the predominant frequency at which the molecules responsible for conducting the electric current normally vibrate at the temperature of the material.

4. The method of claim 1 wherein said material comprises an oxide of a metal atom having 1 to 3 electrons in its outermost level of electrons.

5. The method of claim 1 wherein said predetermined frequency is substantially equal to the resonant frequency of molecular vibration of said metal atom in the metallic oxide.

6. The method of claim 4 wherein said predetermined frequency is substantially equal to the fundamental resonant frequency of molecular vibration of the metal atom in the metallic oxide.

7. The method of claim 4 wherein said electrical potential is applied across the material using two electrically opposite poles, and wherein a first molecule of metallic oxide is adjacent at least second and third molecules of the same metallic oxide, said second molecule being closer to one pole and the third molecule being each closer to the other pole of the electrical potential than said first molecule of metallic oxide, such that the molecules form part of a path or bridge between the poles.

8. The method of claim 4 wherein said material comprises oxides of more than one metal, said metals having 1 to 3 electrons in the outermost level of electrons, and said metals having the same electron level defining said outermost level of electrons.

9. A method for improving the ability of a material which exhibits superconductivity at a relatively low temperature to exhibit superconductivity at a relatively higher temperature, comprising the step of applying a magnetic field across the material at a predetermined frequency and in a predetermined direction, said predetermined frequency being substantially equal to a resonant frequency of a molecular vibration of the material.

10. The method of claim 9 wherein said magnetic field is applied across the material in a direction substantially transverse to a desired path of electrical conductivity through the material.

11. The method of claim 9 wherein said magnetic field is applied across the material in a direction substantially parallel to a desired direction of electrical conductivity through the material.

12. The method of claim 9 wherein said predetermined frequency is substantially equal to the fundamental resonant frequency of molecular vibration of the material.

13. The method of claim 9 wherein said predetermined frequency is substantially equal to a frequency which comprises a harmonic of the fundamental resonant frequency of molecular vibration of the material.

14. The method of claim 9 wherein said material comprises an oxide of a metal having 1 to 3 electrons in its outermost level of electrons.

15. The method of claim 14 wherein said predetermined frequency is substantially equal to the fundamental resonant frequency of molecular vibration of the metallic oxide.

16. The method of claim 14 wherein said predetermined frequency is substantially equal to a frequency which comprises a harmonic of the natural resonant frequency of molecular vibration of the molecule of metallic oxide.

17. The method of claim 9 wherein an electrical potential is applied across the material by two electrical poles at opposite ends of the material, and wherein a first molecule of the metallic oxide is adjacent at least second and third molecules of the same metallic oxide, said second molecule being closer to one pole and said third molecule being each closer to the other pole of the electrical potential than said first molecule of metallic oxide, such that the molecules form part of a path or bridge between the poles.

18. The method of claim 14 wherein said material comprises oxides of more than one metal, said metals each having 1 to 3 electrons in the outermost level of electrons, and said metals having the same electron level defining said outermost level of electrons.

19. A method for increasing the ability of a material which exhibits superconductivity at a relatively low temperature to exhibit superconductivity at a relatively higher temperature, comprising in combination, the steps of:
   (a) applying an electrical potential across the material at a first predetermined frequency and in a first predetermined direction; and
   (b) applying a magnetic field across the material at a second predetermined frequency and in a second predetermined direction, the predetermined frequency of the magnetic field having a predetermined phase relationship to the predetermined frequency of the electrical potential, said first and second predetermined frequencies being selected such that they stimulate a resonant response in phonon activity of the material.

20. The method of claim 19 wherein said first predetermined frequency and said second predetermined frequency are substantially equal.

21. The method of claim 20 wherein said predetermined frequency is substantially equal to the fundamental resonant frequency of molecular vibration of the material.

22. The method of claim 20 wherein said predetermined frequency is substantially equal to a frequency which comprises a harmonic of the fundamental resonant frequency of molecular vibration of the material.

23. The method of claim 20 wherein said material comprises an oxide of a metal having 1 to 3 electrons in its outermost level of electrons.

24. The method of claim 23 wherein said predetermined frequency is substantially equal to the fundamental resonant frequency of molecular vibration of the metallic oxide.

25. The method of claim 23 wherein said predetermined frequency is substantially equal to a frequency which comprises a harmonic to the fundamental resonant frequency of molecular vibration of the metallic oxide.

26. The method of claim 20 wherein said electrical potential is applied using at least two electrical poles, and wherein a first molecule of metallic oxide is adjacent at least second and third molecules of the same metallic oxide, said second molecule being closer to one pole and the third molecule being each closer to the other pole of the electrical potential than said first molecule of metallic oxide.

27. The method of claim 20 wherein said material comprises oxides of more than one metal, said metals having 1 to 3 electrons in the outermost level of electrons, and said metals having the same electron level defining said outermost level of electrons.

28. The method of claim 19 wherein said predetermined direction of the magnetic field is substantially transverse to said predetermined direction of electrical potential across the material.

29. The method of claim 28 wherein the magnetic field is applied substantially in phase with the application of the electrical potential.

30. The method of claim 19 wherein said predetermined direction of said magnetic field is substantially parallel to said first predetermined direction of electrical potential across the material.

31. The method of claim 30 wherein the magnetic field is applied substantially 180° out of phase with the application of the electrical potential.

32. An apparatus for improving the conductivity of a material which exhibits superconductivity at a relatively low temperature, such that the material will exhibit superconductivity at a relatively higher temperature, comprising in combination:
   (a) the material including an oxide of metal having 1 to 3 electrons in its outermost level of electrons, said material having a pre-established level of electrical conductivity; and
   (b) means for applying an electrical potential across the material at a predetermined frequency which is substantially equal to a resonant frequency of molecular vibration of the metallic oxide, whereby said means increases the electrical conductivity of said material.

33. The apparatus of claim 32 wherein said predetermined frequency is substantially equal to the fundamental resonant frequency of molecular vibration of the metal.

34. The apparatus of claim 32 wherein said material comprises a metallic oxide and said predetermined frequency is substantially equal to a resonant frequency of molecular vibration of the metal atom of the metallic oxide.

35. The method of claim 34 wherein said electrical potential is applied by two electrical poles, and a first molecule of metallic oxide is adjacent at least second and third molecules of the same metallic oxide, said second molecule being closer to one electrical pole and said third molecule being each closer to the other pole of the electrical potential than said first molecule of metallic oxide.

36. The method of claim 34 wherein said material comprises oxides of more than one metallic element, said metal elements having 1 to 3 electrons in the outermost level of electrons, and said metal elements having the same electron level defining said outermost level of electrons.

37. An apparatus for improving the conductivity of a material which exhibits superconductivity at a relatively low temperature, such that the material which exhibits superconductivity at a relatively higher temperature, comprising in combination:
   (a) the material including an oxide of a metal having 1 to 3 electrons in its outermost level of electrons, said material having a pre-established level of electrical conductivity;
   (b) means for applying an electrical potential across said material to define a first predetermined direction; and
   (c) means for applying a magnetic field across the material at a predetermined frequency and in a second predetermined direction, said predetermined frequency being substantially equal to a resonant frequency of molecular vibration of the metallic oxide, whereby said means increases the electrical conductivity of said material.

38. The method of claim 37 wherein said magnetic field is applied across the material in a direction substantially transverse to the first predetermined direction.

39. The method of claim 37 wherein said magnetic field is applied across the material in a direction substantially parallel to the first predetermined direction.

40. The method of claim 37 wherein said electrical potential is applied by two electrical poles, and wherein a first molecule of metallic oxide is adjacent at least second and third molecules of the same metallic oxide, said second molecule being closer to one of the electrical poles and third molecule being each closer to the other pole of the electrical potential than said first molecule of metallic oxide.

41. The method of claim 37 wherein said material comprises oxides of more than one metallic element, said metallic elements having 1 to 3 electrons in the outermost level of electrons, and having the same electron level defining said outermost level of electrons.

42. An apparatus for improving the conductivity of a material which exhibits superconductivity at a relatively low temperature such that the material will exhibit superconductivity at a relatively higher temperature, comprising in combination:
(a) the material including an oxide of a metal having 1 to 3 electrons in its outermost level of electrons, said material having a pre-established level of electrical conductivity;
(b) means for applying an electrical potential across the material (i) in a first predetermined direction; and (ii) at a first predetermined frequency which is substantially equal to a resonant frequency of molecular vibration of the material; and
(c) means for applying a magnetic field across the material (i) at a second predetermined frequency; (ii) in a second predetermined direction; and (iii) in a predetermined phase relationship to the application of electrical potential across the material, said second predetermined frequency being equal to a resonant frequency of molecular vibration of a material, whereby said means for applying an electrical potential and said means for applying a magnetic field cooperatively increase the electrical conductivity of said material.

43. The apparatus of claim 42 wherein said first predetermined frequency and said second predetermined frequency are substantially equal.

44. The apparatus of claim 42 wherein the magnetic field is applied substantially in phase with the application of the electrical potential.

45. The apparatus of claim 44 wherein the magnetic field is applied in a predetermined direction which is substantially transverse to the direction of the applied electrical potential.

46. The apparatus of claim 42 wherein the magnetic field is applied substantially 180° out of phase with the application of the electrical potential.

47. The apparatus of claim 46 wherein the magnetic field is applied in a predetermined direction which is substantially parallel to the direction of the applied electrical potential.

* * * * *